United States Patent
Heng et al.

(10) Patent No.: US 8,067,841 B2
(45) Date of Patent: Nov. 29, 2011

(54) SEMICONDUCTOR DEVICES HAVING A RESIN WITH WARPAGE COMPENSATED SURFACES

(75) Inventors: Chai Wei Heng, Melaka (MY); Wae Chet Yong, Malacca (MY); Stanley Job Doraisamy, Kuala Lumpur (MY); Khai Huat Jeffrey Low, Melaka (MY); Gerhard Deml, Munich (DE)

(73) Assignee: Infineon Technologies AG, Neubiberg (DE)

( * ) Notice: Subject to any disclaimer, the term of this patent is extended or adjusted under 35 U.S.C. 154(b) by 454 days.

(21) Appl. No.: 12/036,930

(22) Filed: Feb. 25, 2008

(65) Prior Publication Data
US 2009/0212446 A1 Aug. 27, 2009

(51) Int. Cl.
*H01L 23/29* (2006.01)
(52) U.S. Cl. . 257/788; 257/787; 257/730; 257/E23.117; 438/127
(58) Field of Classification Search .................. 257/686; 438/127
See application file for complete search history.

(56) References Cited

U.S. PATENT DOCUMENTS

| 5,766,985 A * | 6/1998 | Mangiagli et al. ............ 438/121 |
| 6,388,338 B1 * | 5/2002 | Romano' et al. ............. 257/787 |
| 2005/0048699 A1 | 3/2005 | Matsunami |

OTHER PUBLICATIONS

PSI Technologies Inc., Power packages, TO 220 Fullpack (Isolated TO 220), Feb. 12, 2006, http://web.archive.org./web/20060212183151/http://psitechnologies.com/products/to220fullpack.*

* cited by examiner

*Primary Examiner* — Marcos D. Pizarro
*Assistant Examiner* — Eva Yan Montalvo
(74) *Attorney, Agent, or Firm* — Slater & Matsil, L.L.P.

(57) ABSTRACT

A semiconductor device including: a die pad, a die on the die pad, and resin encapsulating the die and forming an isolation thickness over the die pad, the resin including a mounting aperture and a major surface configured for mounting to an external device, the major surface having a non warpage compensation portion adjacent the die and a warpage compensation portion in a relatively thermally inactive zone with an approximate discontinuity and/or abrupt change in gradient between the non warpage compensation portion and the warpage compensation portion.

25 Claims, 8 Drawing Sheets

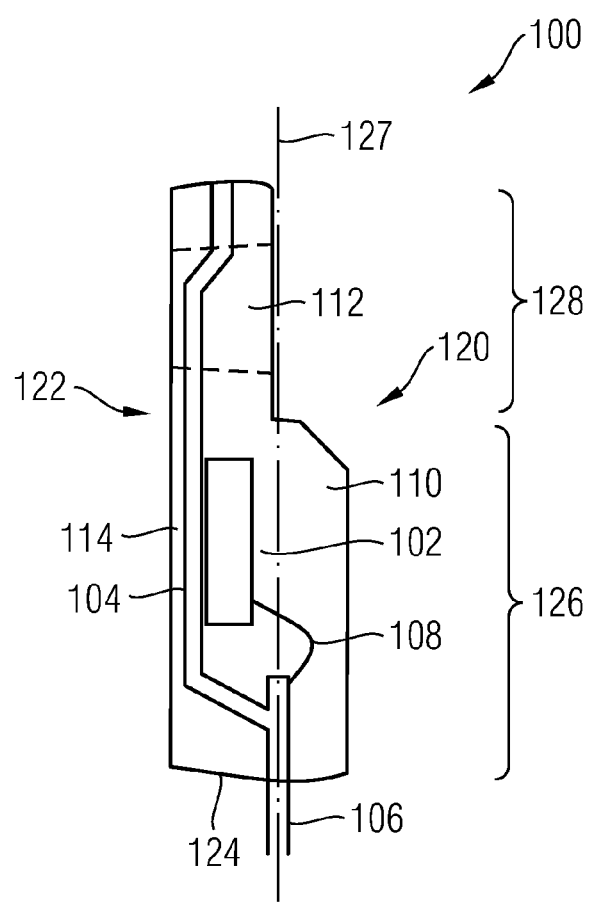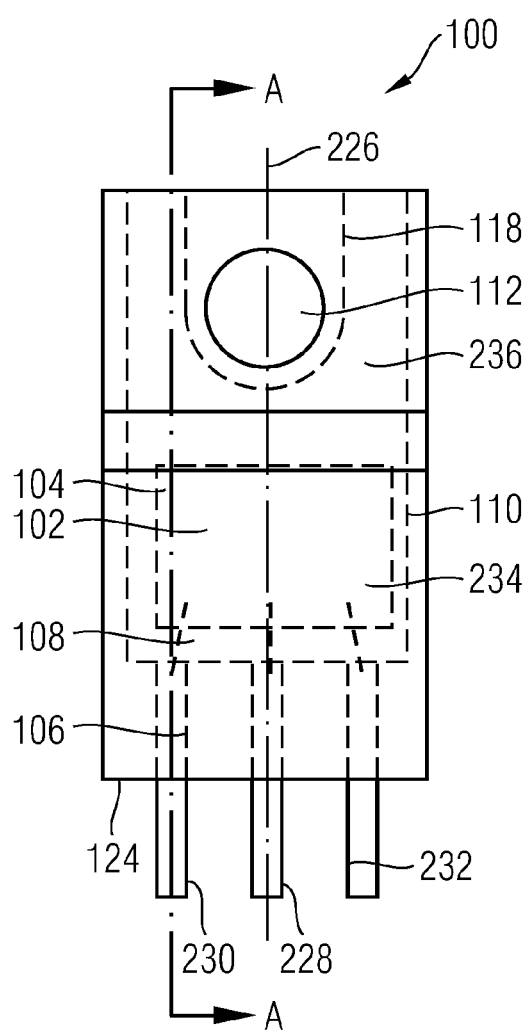

PRIOR ART

SEMICONDUCTOR DEVICES HAVING A RESIN WITH WARPAGE COMPENSATED SURFACES

BACKGROUND

Embodiments of this invention relate to a semiconductor device, a method of packaging a semiconductor device, a method of mounting a semiconductor device, and refers particularly, though not exclusively, to packaging of a semiconductor device possessing thermal dissipation structure.

Various types of semiconductor packages exist where the semiconductor is encapsulated in resin. In some types of encapsulated devices the semiconductor die is located on a die pad. The die pad is part of the metal leadframe. The die pad may be exposed on one face to allow better thermal dissipation. In other cases the die pad may be covered by a portion of the resin encapsulate known as an isolation thickness.

For high power applications, for example, a Transistor Outline ("TO") package, it may be necessary to attach the TO package to an external heat sink to dissipate the heat generated by the transistor. Some TO packages include a screw hole for mounting the TO package to an external heat sink.

BRIEF DESCRIPTION OF THE DRAWINGS

There shall now be described by way of non-limitative, example only some exemplary embodiments, the description being with reference to the accompanying illustrative drawings in which:

FIG. 1 is a cross-sectional view of a package according to an exemplary embodiment;

FIG. 2 is a front view of a package according to the exemplary embodiment in FIG. 1;

DETAILED DESCRIPTION OF ILLUSTRATIVE EMBODIMENTS

Figure 3A:
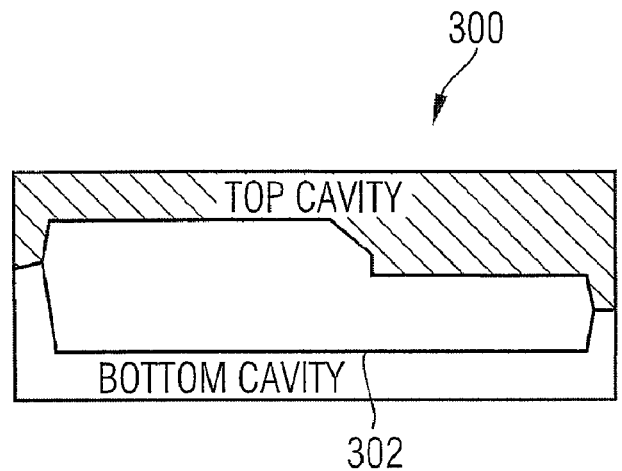
FIGS. 3(a) to 3(c) are simplified cross section views of encapsulation and curing of a prior art package.

A Transistor Outline 220 FullPak ("TO-220FP") package 100 according to an exemplary embodiment is shown in FIGS. 1 and 2. The package 100 includes a transistor semiconductor die 102 on a metal die pad 104. The die 102 on the die pad 104 does not necessarily mean directly on the die pad 104, as there may be intermediate layers in between. A number of leads 106 provide external electrical connection and are electrically connected to the die 102 via wire bonds 108. The device is encapsulated by resin 110. The resin 110 defines a mounting aperture or screw hole 112 used to attach the package to an external heat sink (not shown) or other heat transfer device. The die pad 104 is surrounded by the resin 110, with an isolation thickness 114 of resin between the die pad and the external heat sink (not shown).

The term "minimum isolation thickness" means an isolation thickness which is as thin as the mold compound filler size will allow. For example, with a TO-220FP package a minimum isolation thickness may be about 0.35 mm (may depend on the mold compound). An advantage of using a minimum isolation thickness may be an improvement in the heat dissipation of the device. For example the isolation thickness in FIGS. 1 and 2 may be between about 0.7 mm and about 0.35 mm.

The package 100 includes a front face 120 and a back face 122 and the resin 110 is generally formed with two cuboid portions in external shape with each portion having a different thickness. The bottom portion 126 of resin extending for the first two thirds of the length from the bottom end 124 is approximately twice as thick as the top portion 128 extending for the final third of the length. The leads 106 extend from the bottom end 124 of the resin 110. The resin defines a longitudinal axis 226. The center of the die 102 is located approximately one third along the length of the resin 110 starting from the bottom end 124, and is centered about the longitudinal axis 226. The center of screw hole 112 is located approximately three quarters along the length of the resin 110 starting from the bottom end 124, centered about the longitudinal axis 226. The leads 106 extend from an imaginary center line 127 between the front face 120 and a back face 122 at the bottom end 124. The middle lead 228 is physically connected to the die pad 104 and the side leads 230, 232 are physically spaced from and electrically connected to the die 102. The die pad 104 includes a portion 234 surrounding the die 102, and another portion 236 surrounding the screw hole 112. The portion 236 surrounding the screw hole 112 is spaced therefrom by an isolation portion 118 of the resin 110.

Using a minimum isolation thickness may affect package distortion or warpage during curing of the resin 110. Because the resin 110 and the die pad 104 have different coefficients of expansion, distortion may occur when the resin 110 is heated during curing. After curing, the resin 110 is hard so it retains the distorted shape even after it has cooled. The degree of warpage may be related to the isolation thickness. For example reducing the isolation thickness may increase warpage.

A certain amount or warpage can be accommodated by filing any gaps between the die pad and the heat sink with thermal paste. However a larger gap may still degrade the thermal performance. By providing warpage compensation in the shape of the mold die, the degree of warpage after curing can be reduced.

The term "warpage compensation portion" means an additional portion of resin 110 that at least partially compensates for the distortion or warpage that occurs during curing.

Figure 3B:
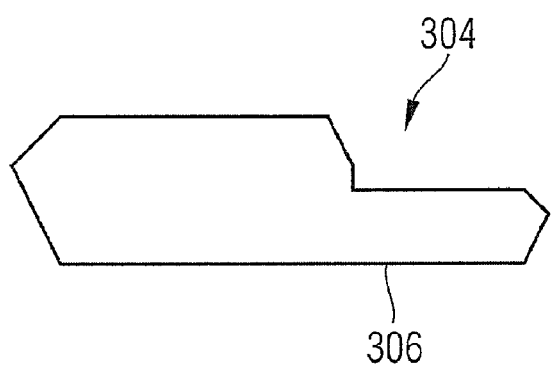
Figure 3C:
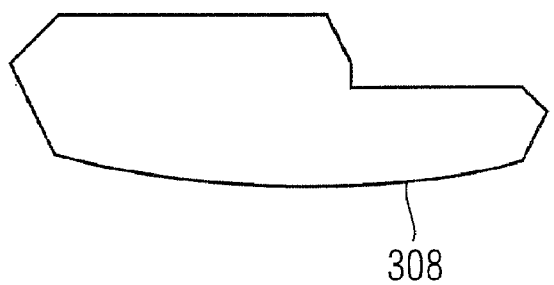
Figure 4A:
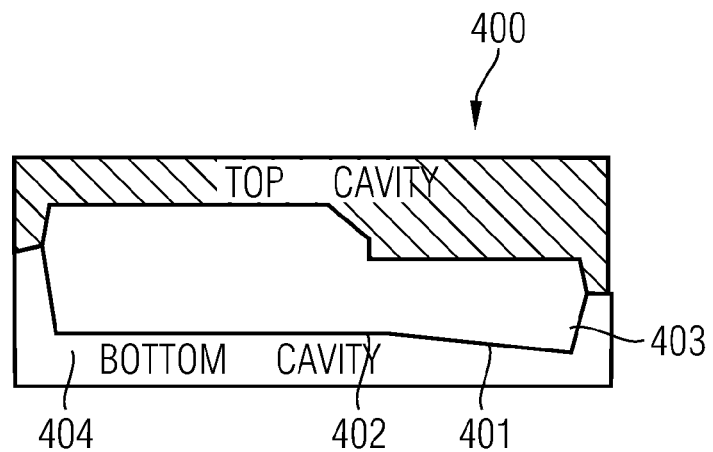
FIGS. 4(a) to 4(c) are simplified cross section views of encapsulation and curing of a package according to the exemplary embodiment.
Figure 4B:
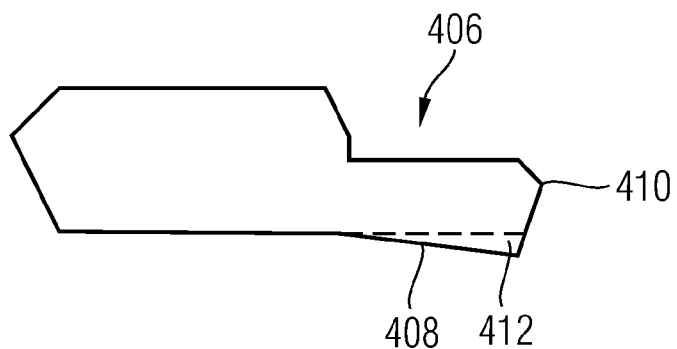
Figure 4C:
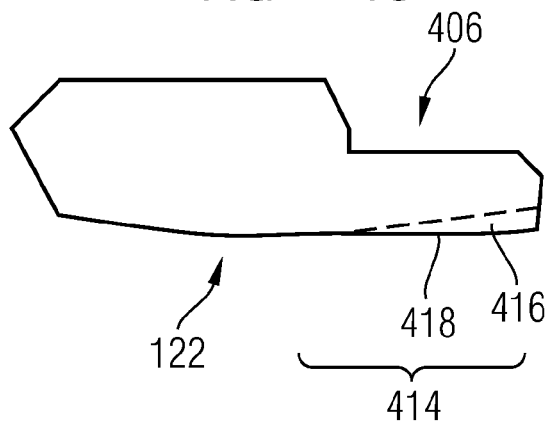

For example as shown in FIGS. 3(a) to 3(c) if a mold die 300 is designed with a flat bottom cross sectional profile 302, the package 304 produced will have a similarly flat bottom profile 306 but after curing may have a distorted or warped bottom profile 308 (the level of distortion is exaggerated for illustration purposes). As seen in FIG. 4(a) a mold 400 according to the exemplary embodiment may include a wedge shaped depression 401 in the cross sectional profile 402 of the lower mold die 404. The wedge shaped depression 401 is located in the end 403 of the lower mold die 404 nearest where the screw hole will be formed. The thickest portion of the wedge shaped depression 401 forms part of the end 403 and may extend across the entire width. FIG. 4(b) shows a package 406 produced using the lower mold die 404 having a wedge portion 408 extending approximately one third of the length from the top end 410 and across the entire width. The wedge 408 has its thickest portion 412 at the top end 410 distant from the die 102. FIG. 4(c) shows the package 406 after curing, with at least the top half 414 of the back face 122 having reduced warpage as compared to FIG. 3(c). The warpage compensation portion 416 in the finished product corresponds to the wedge 408 before curing, that after curing has a substantially flat lower face 418.

Using a warpage compensation portion 416 may have the advantage of reducing the level of warpage after the device has been cured.

The warpage compensation portion 416 may be located in a relatively thermally inactive zone of the resin. The term "relatively thermally inactive zone" means a zone of the resin that is lower in heat transfer between the die and the heat sink. For example in a TO-220FP package the area between the die 102 and the heat sink is where the majority of the heat transfer takes place. Fringe areas such as adjacent the screw hole, and, depending on the application and/or package configuration potentially the other end distant from the screw hole, may, for example, be relatively thermally inactive.

The warpage compensation portion 416 may be between about 10-50 μm at its thickest portion, for example, about 30 μm, and between about 3-7 mm long, for example, about 5.3 mm long. The warpage compensation portion may extend over the entire width of the resin 110, and one surface may form part of the back face 122 and another surface may form part of the top end 410.

Figure 9:
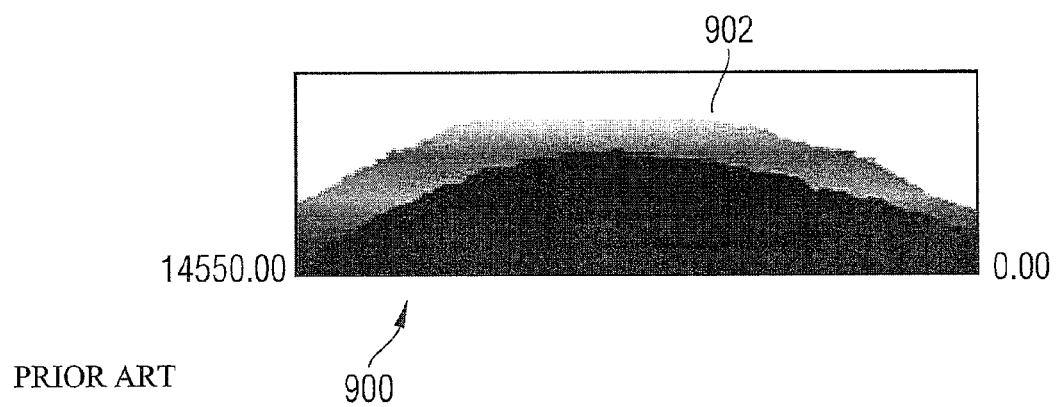
FIG. 9 is a surface profile graph of a prior art package.
Figure 10:
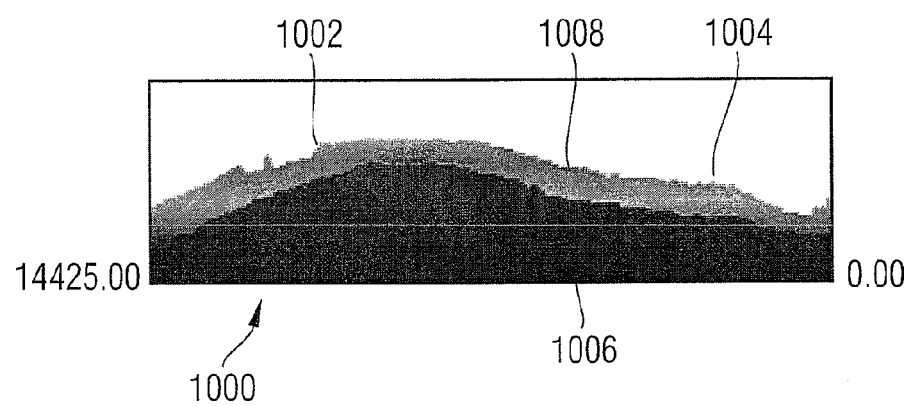
FIG. 10 is a surface profile graph of a package according to the exemplary embodiment.

As seen in FIG. 9 a non warpage compensated package 900 includes a generally curvilinear back surface 902. In longitudinal cross section the back surface 902 has a profile approximately following a sector of an asymmetrical ellipse or is generally curved with a smoothly varying radius. In contrast a package 1000 according to the exemplary embodiment, shown in FIG. 10, includes a non warpage compensation portion 1002 and a warpage compensation portion 1004. The warpage compensation portion 1004 covers the relatively thermally inactive zone surrounding the screw hole. The non warpage compensation portion 1002 covers the remaining area particularly adjacent the die. In longitudinal cross section the non warpage compensation portion 1002 similarly has a profile approximately following a sector of an asymmetrical ellipse or generally curved with a varying radius. The warpage compensation portion 1004 is generally flat, inclined at a very small angle to the central longitudinal axis 1006 of the package. An approximate discontinuity and/or abrupt change in gradient 1008 is evident between the non warpage compensation portion 1002 and the warpage compensation portion 1004. Alternatively the profile of the package 900 in FIG. 9 is generally a smooth shape whereas the profile of the package 1000 in FIG. 10 has two distinctly shaped portions.

Figure 5A:
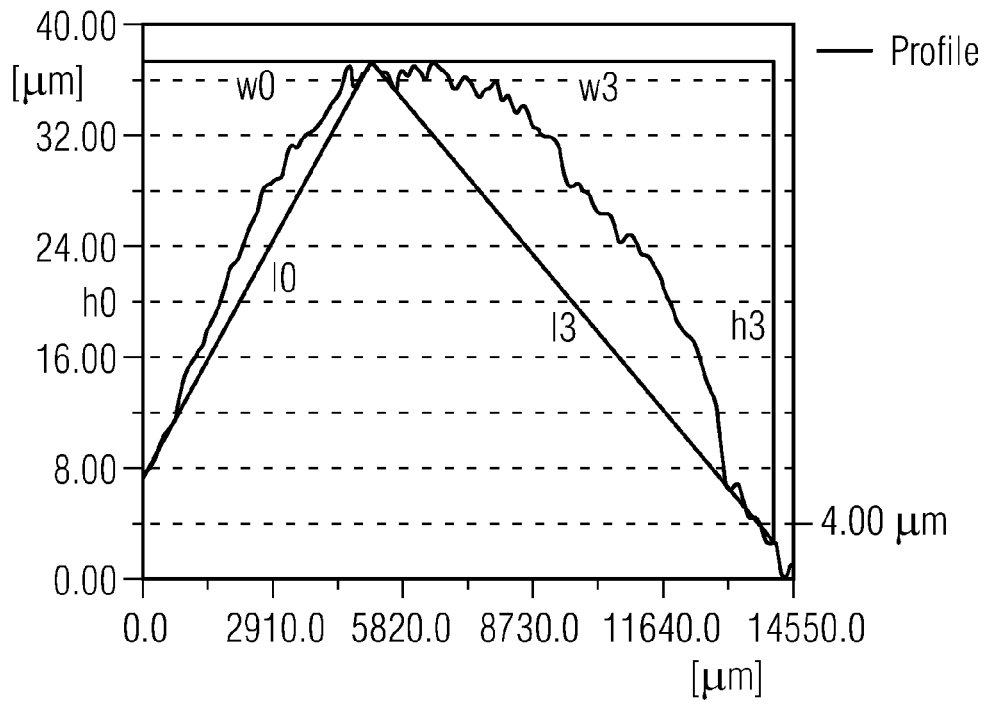
FIGS. 5(a) to 5(d) are simulated graphs of warpage of a prior art package compared to the exemplary embodiment.
Figure 5B:
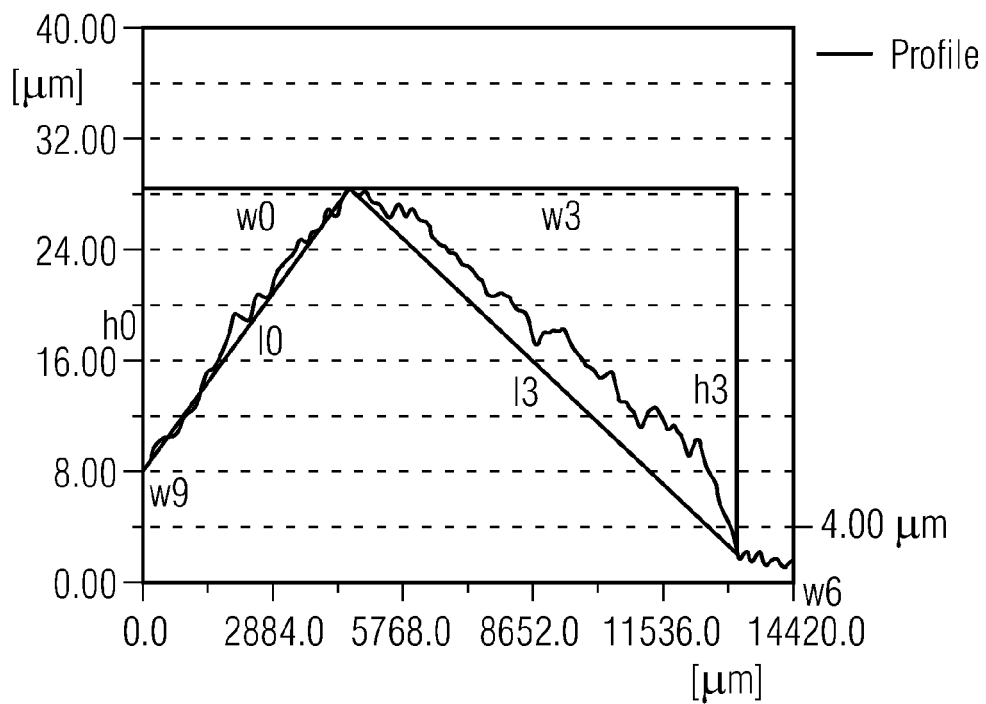
Figure 5C:
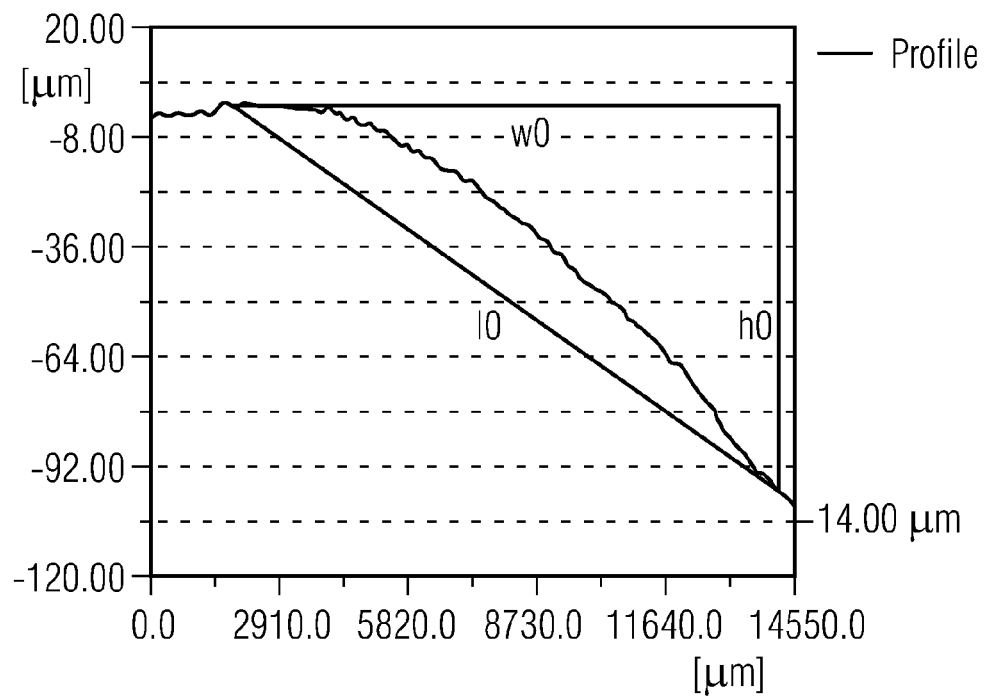
Figure 5D:
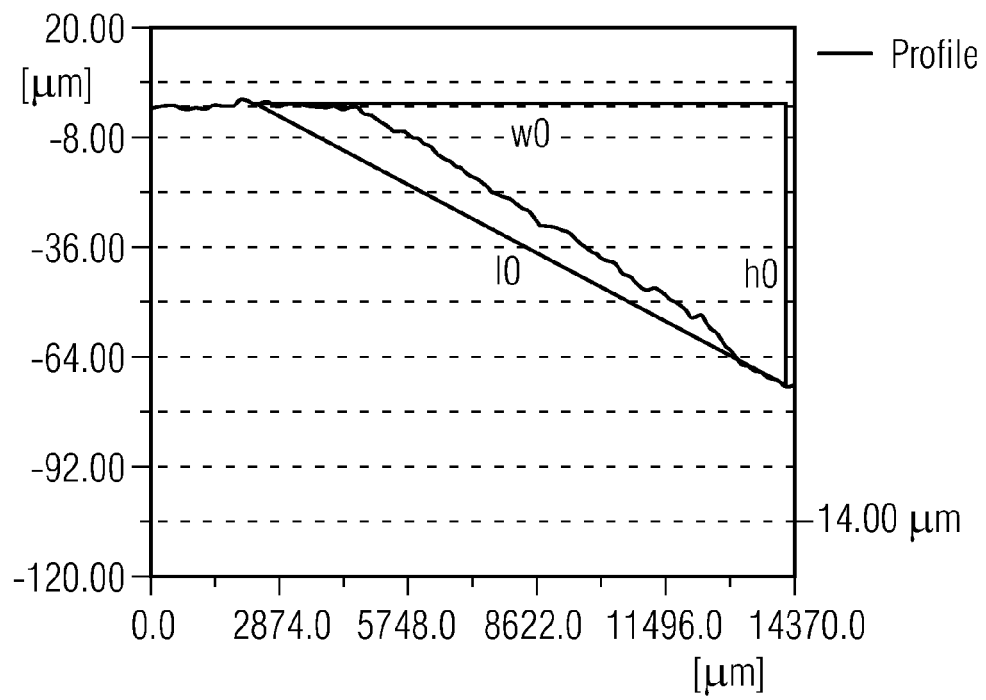
Figure 6:
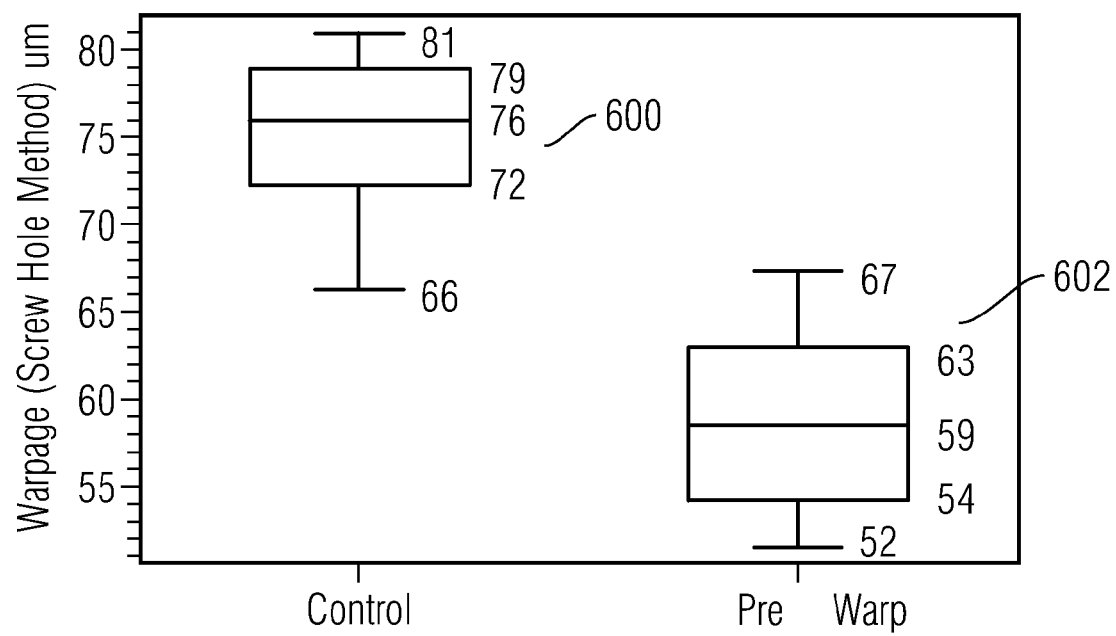
FIG. 6 is a box and whisker diagram of experimentally derived warpage of a prior art package compared to the exemplary embodiment.

FIGS. 5(a) to 5(d) and 6 show a reduction in warpage using the exemplary embodiment. In FIG. 5(a) a TO-220FP package with a minimum isolation thickness without a warpage compensation portion the simulated warpage h3 is about 33 μm. In FIG. 5(b) with a warpage compensation portion according to the exemplary embodiment (wedge is about 30 μm thick and about 5.3 mm long) the simulated warpage h3 is about 25 μm. In FIG. 5(c) a TO-220FP package with a minimum isolation thickness without a warpage compensation portion mounted on a heat sink the simulated gap h0 at the bottom end (distal from the screw hole) is 100 μm. In FIG. 5(d) with a warpage compensation portion according to the exemplary embodiment the simulated gap h0 at the bottom end is 70 μm. In FIG. 6 a box and whisker plot from experimental data shows the mean gap h0 at the bottom end of a TO-220FP package 600 with a minimum isolation thickness without a warpage compensation portion mounted on a heat sink is about 76 μm compared to about 59 μm for a package 602 with a warpage compensation portion according to the exemplary embodiment.

Figure 7:
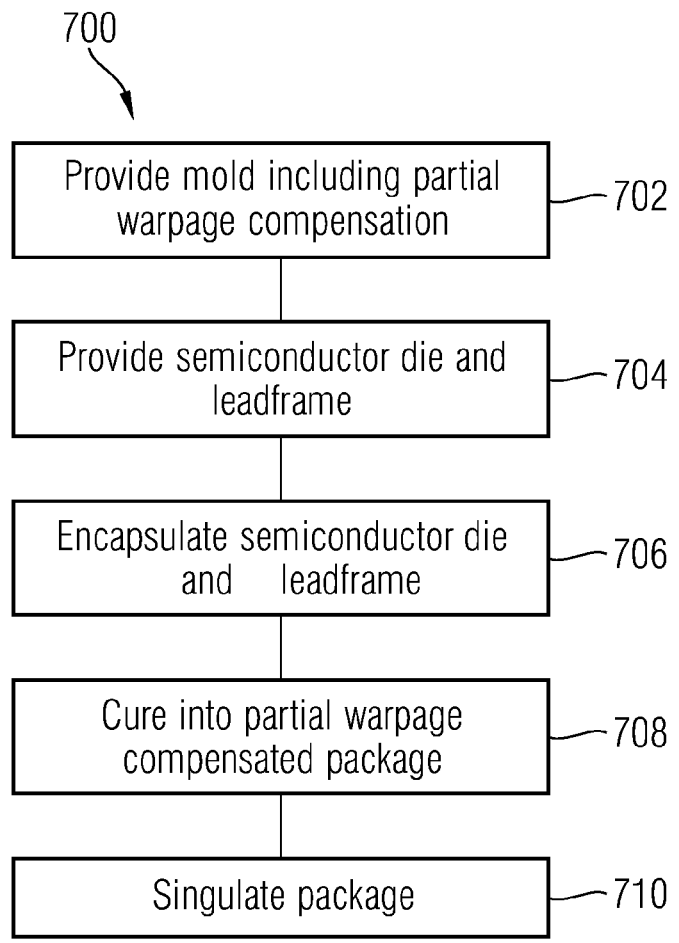
FIG. 7 is a flow diagram of a method of manufacturing according to an exemplary embodiment.

A method 700 of manufacturing a semiconductor package according to an exemplary embodiment is shown in FIG. 7. At 702 a mold is provided including a partial warpage compensation portion. At 704 a leadframe and die are provided. At 706 the die 102 and leadframe are encapsulated by resin 110. At 708 the resin 110 is cured. At 710 the leadframe is singulated.

Providing the mold 702 may be implemented by including a wedge shaped depression 401 at the end of the lower cross sectional profile 402 of the lower mold die 404 nearest where the screw hole will be formed.

Providing a leadframe and die 704 may be implemented by gluing or soldering each die 102 to a large number of copper leadframes attached together in a strip. As such a die on a die pad does not necessarily mean directly on the die pad, as there may be intermediate layers in between. Each leadframe is connected to the next which allows mass production of a large number of semiconductors. Wires 108 may be soldered from each of the leads 106 to surface contacts on the die 102.

Encapsulation 706 may be implemented by placing the leadframe with the attached and bonded die into a mold cavity and filing the cavity with resin. The resin forms, among other things, an isolation thickness 114 covering the back face of the die 102, a screw hole 112 and a wedge 408 proximate the screw hole 112.

Curing 708 may be implemented by subjecting the resin 110 to a raised temperature for a period of time. For example, the package 100 may be baked at 1750° C. for 2 hours depending on the mold compound. The cured package 706 includes a warpage compensation portion having a substantially flat lower cross sectional profile.

Singulation 710 may be implemented by cutting the leads 106 at the appropriate place to form a separate device.

Figure 8:
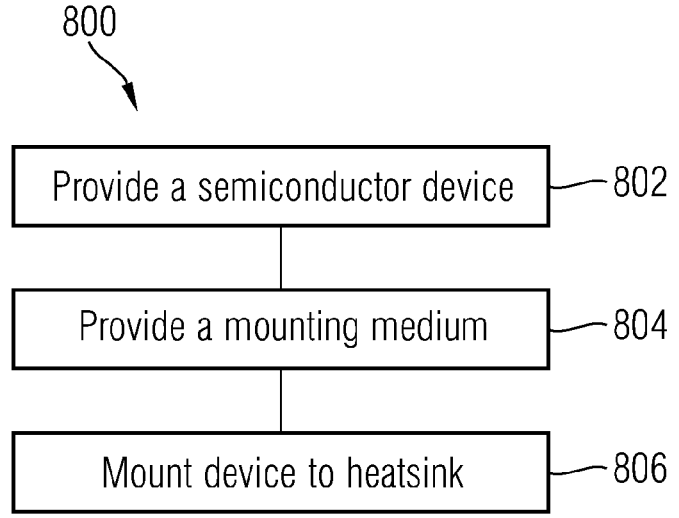
FIG. 8 is a flow diagram of a method of mounting according to an exemplary embodiment.

A TO package according to the exemplary embodiment may be mounted according the method 800 in FIG. 8. At 802 a semiconductor device 100 is provided including an isolation thickness 114, a warpage compensation portion 416 and a mounting aperture 112. At 804 a mounting medium, such as heat conducting paste or silica foil, is provided between an external heat sink and the device 100. At 806 the device 100 is mounted to the heat sink. For example a TO-220FP package according to the exemplary embodiment may be mounted a torque of about 60 Ncm with a maximum gap of about 30 μm Whilst exemplary embodiments of the invention have been described in detail, many variations are possible within the scope of the invention as will be clear to a skilled reader. For example, while a TO-220FP package has been described and illustrated other packages may be applicable depending on the application, such as TO (Transistor outline) packages with THD (Through Hole Device) mounting type and/or overmold or fullpack type packages where the whole package is encapsulated with mold compound.

What is claimed is:

1. A semiconductor device comprising:
   a die pad;
   a die on the die pad; and
   resin encapsulating the die and forming an isolation thickness over the die pad, the resin including a mounting aperture and a major surface configured for mounting to an external device, the major surface having a non warpage compensation portion at least directly under the die and a warpage compensation portion adjacent the mounting aperture in a relatively thermally inactive zone, wherein the major surface has an approximate discontinuity and/or abrupt change in gradient between the non warpage compensation portion and the warpage compensation portion.

2. The device in claim 1, wherein the die comprises a transistor and the semiconductor device is a transistor outline semiconductor device.

3. The device in claim 1, wherein the isolation thickness is between 0.7 mm and 0.35 mm thick.

4. The device in claim 1, wherein the warpage compensation portion extends approximately one third of the length of the major surface and its entire width.

5. The device in claim 1, wherein the device is a TO220 transistor outline package.

6. The device in claim 1, wherein the non warpage compensation portion has a generally curved profile and the warpage compensation portion has a generally flat profile.

7. The device in claim 1, wherein the isolation thickness of the resin on the die pad is substantially even across the die pad.

8. A semiconductor device comprising:
a die pad;
a die disposed on the die pad;
a resin surrounding the die pad and the die, the resin comprising a first portion and a second portion, the first portion of the resin disposed over and under the die and having a first thickness, the second portion of the resin laterally spaced from the first portion and having a second thickness smaller than the first thickness, each of the first and the second portions of the resin having a top surface over the die and the die pad, and an opposite back surface under the die and the die pad, the back surface of the first portion and the back surface of the second portion forming a common back surface configured for mounting an external device; and
a mounting aperture defined by the second portion of the resin, wherein the back surface of the first portion comprises a curved surface, and wherein the back surface of the second portion comprises a substantially flat surface.

9. The device of claim 8, wherein the back surface of the first portion follows a sector of an asymmetrical ellipse.

10. The device of claim 8, wherein the back surface of the first portion and the back surface of the second portion are joined by an abrupt change.

11. The device of claim 8, wherein the die comprises a transistor and the semiconductor device is a transistor outline semiconductor device.

12. The device of claim 8, wherein a thickness of an isolation region formed by the resin between the die pad and the back surface of the first portion is between 0.7 mm and 0.35 mm thick.

13. The device of claim 8, further comprising leads extending from a bottom end of the first portion to a top end of the second portion, wherein a length of the first portion along the leads is about twice a length of the second portion along the leads.

14. A semiconductor device comprising:
a die pad having a top surface and an opposite bottom surface;
a die having a top surface and an opposite bottom surface disposed on the top surface of the die pad;
a resin surrounding the die pad and the die, the resin comprising a first portion and a second portion, the first portion of the resin disposed directly over and directly under the die and having a first thickness, the second portion of the resin laterally spaced from the first portion and having a second thickness smaller than the first thickness, each of the first and the second portions of the resin having a top surface and an opposite back surface, the back surface of the first portion being disposed under the back surface of the die pad, the back surface of the second portion being laterally spaced from the back surface of the first portion and below the back surface of the die pad;
a mounting aperture disposed in the second portion of the resin; and
a common back surface formed by the back surface of the first portion and the back surface of the second portion, wherein the back surface of the first portion comprises a curved surface, and wherein the back surface of the second portion comprises a substantially flat surface.

15. The device of claim 14, wherein the back surface of the first portion follows a sector of an asymmetrical ellipse.

16. The device of claim 14, wherein the back surface of the first portion and the back surface of the second portion are joined by an abrupt change.

17. The device of claim 14, wherein the device is a TO220 transistor outline package.

18. The device of claim 14, wherein the die comprises a transistor and the semiconductor device is a transistor outline semiconductor device.

19. A semiconductor structure comprising:
a die pad;
a die disposed on the die pad;
an uncured resin surrounding the die pad and the die, the uncured resin comprising a first portion and a second portion along a first direction, the first portion of the uncured resin disposed over and under the die, the first portion having a first thickness along a second direction perpendicular to the first direction, the second portion of the uncured resin disposed adjacent the die, the second portion having a second thickness along the second direction, the second thickness being smaller than the first thickness, each of the first and the second portions of the uncured resin having a top surface over the die and the die pad, and an opposite back surface under the die and the die pad; and
a mounting aperture disposed in the second portion of the uncured resin, wherein the back surface of the first portion comprises a substantially flat surface, and wherein the back surface of the second portion comprises a wedge protruding away from the substantially flat surface, wherein a maximum thickness of the wedge along the second direction is located at a top end of the second portion of the uncured resin.

20. The semiconductor structure of claim 19, wherein the wedge has a surface at the maximum thickness that forms part of an end face of the semiconductor structure.

21. The semiconductor structure of claim 19, wherein the maximum thickness of the wedge is between 10 μm to 50 μm thick.

22. The semiconductor structure of claim 21, wherein the maximum thickness of the wedge is about 30 μm.

23. The semiconductor structure of claim 19, wherein a length of the wedge along the first direction is between 3 mm and 7 mm.

24. The semiconductor structure of claim 19, wherein a length of the wedge along the first direction is about 5.3 mm.

25. The semiconductor structure of claim 19, wherein the back surface of the first portion and the back surface of the second portion are joined by an abrupt change in slope.

* * * * *